United States Patent
Proell et al.

(10) Patent No.: US 7,039,838 B2
(45) Date of Patent: May 2, 2006

(54) METHOD FOR TESTING A CIRCUIT UNIT TO BE TESTED AND TEST APPARATUS

(75) Inventors: Manfred Proell, Dorfen (DE); Koen Van Der Zanden, Munich (DE)

(73) Assignee: Infineon Technologies AG, Munich (DE)

( * ) Notice: Subject to any disclaimer, the term of this patent is extended or adjusted under 35 U.S.C. 154(b) by 449 days.

(21) Appl. No.: 10/206,785

(22) Filed: Jul. 26, 2002

(65) Prior Publication Data

US 2003/0056162 A1    Mar. 20, 2003

(30) Foreign Application Priority Data

Jul. 27, 2001    (DE) .................................. 101 36 700

(51) Int. Cl.
G01R 31/28    (2006.01)
G11C 29/00    (2006.01)
G11C 7/00    (2006.01)

(52) U.S. Cl. ........................ 714/724; 714/718; 365/201

(58) Field of Classification Search ................ 714/718, 714/719, 724; 365/200, 201, 222, 233, 230.03
See application file for complete search history.

(56) References Cited

U.S. PATENT DOCUMENTS

| | | | |
|---|---|---|---|
| 5,305,253 A * | 4/1994 | Ward .......................... | 365/73 |
| 5,499,213 A * | 3/1996 | Niimi et al. ................. | 365/222 |
| 5,959,930 A * | 9/1999 | Sakurai ................... | 365/230.03 |
| 6,023,440 A * | 2/2000 | Kotani et al. .......... | 365/230.03 |
| 6,038,181 A | 3/2000 | Braceras et al. ............ | 365/201 |
| 6,067,261 A * | 5/2000 | Vogelsang et al. .......... | 365/201 |
| 6,191,985 B1 | 2/2001 | Grätz et al. ................. | 365/200 |
| 6,295,238 B1 * | 9/2001 | Tanizaki et al. ............ | 365/201 |
| 2002/0066058 A1 * | 5/2002 | Sugamoto et al. .......... | 714/724 |

OTHER PUBLICATIONS

IBM, Multiple Word Line Selection for Reducing Semiconductor Memory Test Time., Oct. 1990, IBM Technical Disclosure Bulletin, vol. 33, Issue 5, pp. 447-448, NN9010447.*

* cited by examiner

*Primary Examiner*—Albert Decady
*Assistant Examiner*—John J. Tabone, Jr.
(74) *Attorney, Agent, or Firm*—Fish & Richardson P.C.

(57) ABSTRACT

The invention provides a method for testing a circuit unit (101) to be tested, in which a test time is reduced, at least one word line (102a–102N) of the circuit unit (101) to be tested being activated by application of at least one test signal (103) to the word line (102a–102N), the at least one word line (102a–102N) being deactivated by removal of the test signal (103) from the word line (102a–102N), the word lines among all the word lines (102a–102N) which have not run through an activation-deactivation cycle being read out in order to determine an influence of the activation and deactivation, and the test result being output.

14 Claims, 3 Drawing Sheets

METHOD FOR TESTING A CIRCUIT UNIT TO BE TESTED AND TEST APPARATUS

RELATED APPLICATIONS

This application claims the benefit of the Jul. 27, 2001 priority date of German application 101 36 700.7, the contents of which are herein incorporated by reference.

BACKGROUND

Field of Invention

The present invention relates to a method for testing circuit units to be tested, and relates in particular to a method for testing circuit units to be tested in which a test time is reduced.

Testing of circuit units to be tested, in particular for testing memory units to be tested, is executed for example using a BI device (BI=Burn-In), a so-called SPST test (SPST=Short Parallel Select Test) being carried out.

In order that, by means of an SPST test, after writing of a background, each of the N word lines of a circuit unit to be tested or a memory unit to be tested is activated and subsequently deactivated, this operation typically being carried out 125,000 times, a considerable test time is required.

During these activation-deactivation cycles, a maximal word line voltage change per unit time (du/dt) is required, so that a pump effect is achieved via the circuit unit arranged on a substrate, which pump effect impairs, or discharges, the cells charged with a physical one level in the vicinity of an activated word line. Conversely, it is possible for the cells charged with a physical zero level to be charged in the vicinity of a word line.

A typical memory unit to be tested has, for example, a size of 4×64 MB=256 MB, if this is subdivided into four circuit or memory subunits. A maximum number of word lines, amounting to 8192, is provided for each circuit subunit (64 MB).

In a conventional method for testing circuit units to be tested, an SPST test on a BI device works with an activation time of 200 ns (nanoseconds) and a deactivation time of likewise 200 ns, resulting in a time duration for an activation-deactivation cycle of 400 ns. With the abovementioned specification for testing circuit units to be tested of activating a word line 125,000 times, the total test time required is calculated according to the following equation:

> (200 ns (activation time)+200 ns (deactivation time)×8192 (word lines/memory subunit)×4 (typical number of memory subunits as specified above)×125,000 (number of activation-deactivation cycles)=1638.4 seconds Consequently, a total test time of almost half an hour results, in a disadvantageous manner, which is costly for efficient testing of circuit units to be tested. With an increasing memory size of circuit units to be tested, the total test time is lengthened accordingly.

SUMMARY

Therefore, it is an object of the present invention to provide a method for testing circuit units to be tested in which a test time is reduced.

This object is achieved according to the invention by means of the method specified in Patent Claim 1 and by means of a test apparatus having the features of Claim 9.

An essential concept of the invention consists in using an internal oscillator provided in the circuit unit to be tested in order to provide reduced time durations for activation-deactivation cycles.

The invention's method for testing a circuit unit to be tested, in which a test time is reduced, essentially has the following steps:

a) introduction of the circuit unit to be tested into a test apparatus;
b) activation of at least one word line of the circuit unit to be tested by application of at least one test signal to the word line;
c) deactivation of the word line by removal of the test signal from the word line;
d) read-out of the word lines among all the word lines which were not activated and not deactivated, in order to determine an influence of the activation and deactivation; and
e) outputting of a test result.

In accordance with one preferred development of the present invention, the test signal with which the at least one word line is activated is derived from an internal oscillator of the circuit unit to be tested.

In accordance with a further preferred development of the present invention, an activation-deactivation cycle of the at least one word line is controlled by the internal oscillator of the circuit unit to be tested, so that a coupling of the activation-deactivation cycle to clock times of the circuit unit to be tested is advantageously achieved.

In accordance with yet another preferred development of the present invention, the activation-deactivation cycle of the at least one word line, which cycle is controlled by the internal oscillator of the circuit unit to be tested, corresponds to a timing by an internal refresh cycle.

In accordance with yet another preferred development of the present invention, the activation-deactivation cycle on the at least one word line, which cycle is controlled by the internal oscillator of the circuit unit to be tested, acts simultaneously on all the circuit subunits of the circuit unit to be tested.

In an advantageous manner, in addition to the activation-deactivation cycle controlled by the internal oscillator, the refresh cycle also acts on all the circuit subunits of the circuit unit to be tested.

In accordance with yet another preferred development of the present invention, the activation-deactivation cycle on the at least one word line, which cycle is controlled by the internal oscillator of the circuit unit to be tested, is carried out with a frequency which corresponds to a frequency of the refresh cycle of the circuit unit to be tested. In particular, the advantage is afforded that toggling (i.e. alternate switching on and off) of the at least one word line corresponds to an activation-deactivation cycle, a frequency of a refresh cycle being $\frac{1}{70}$ ns (ns=nanoseconds).

In accordance with yet another preferred development of the present invention, the activation-deactivation cycle controlled by the internal oscillator of the circuit unit to be tested is executed within 70 nanoseconds(ns).

The invention's test apparatus for testing a circuit unit to be tested furthermore has:

a) an internal oscillator in the circuit unit to be tested, which oscillator serves for outputting a clock signal with which an activation-deactivation cycle is executed;
b) a test signal generating device for generating a predeterminable test signal which is fed to the circuit unit to be tested or the individual circuit subunits of the circuit unit to be tested;

c) a ring counter for driving at least one word line of the circuit unit to be tested with the test signal, the ring counter counting through the word lines from a word line a through word lines i up to a word line N (i=running index); and d) a clock signal conditioning unit for applying the clock signal to the ring counter after passing through a first pulse generating unit or a second pulse generating unit in accordance with a switching position of the switching device.

DRAWINGS

Exemplary embodiments of the invention are illustrated in the drawings and are explained in more detail in the description below.

EXEMPLARY EMBODIMENTS

Figure 1:
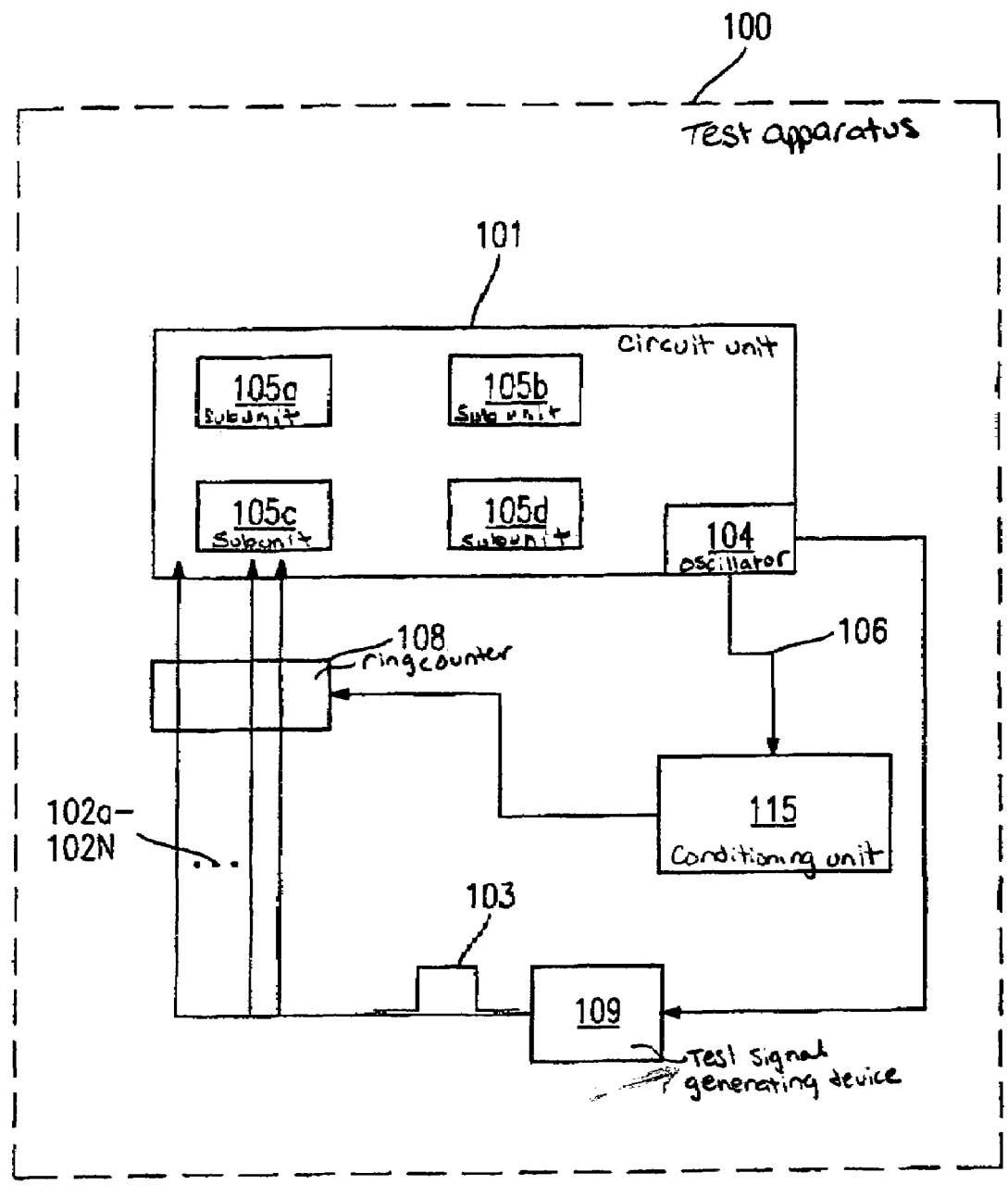
FIG. 1 shows a block diagram of a test apparatus for testing a circuit unit to be tested in accordance with an exemplary embodiment of the present invention.

FIG. 1 diagrammatically shows a test apparatus 100, into which a circuit unit 101 to be tested is introduced. It shall be pointed out that only the essential components are represented in this illustrated exemplary embodiment of the present invention. In particular, it shall be noted that the circuit unit 101 to be tested is subdivided into four circuit subunits 105a, 105b, 105c and 105d in this example.

By way of example, these circuit subunits 105a–105d may be four 64 MB memory subunits, without the invention being restricted thereto.

It is known that the memory units to be tested or the circuit subunits to be tested are connected to word lines 102a–102N, 8192 word lines typically being provided per memory subunit (64 MB) which results, as mentioned above, in a total number of 32,768 word lines for applying signals to all the circuit subunits 105a–105d. According to the invention, an internal oscillator 104 arranged internally within the circuit unit 101 to be tested is used in order to provide a clock signal 106.

The clock signal 106 is fed to a clock signal conditioning unit 115, which comprises, inter alia, a first pulse generating unit 110, a second pulse generating unit 111, a switching device 107 and a gate unit 114, the method of operation of the clock signal conditioning unit 115 being clarified in detail below with reference to FIG. 3. As shown diagrammatically in FIG. 1, an output signal of the clock signal conditioning unit 115 is fed to a ring counter 108, which ensures that in each case only one specific word line 102a–102N is addressed.

A test signal 103 derived from a test signal generating device 109 is applied to the addressed word line, which test signal is provided, for example, as mentioned above, as an activation-deactivation cycle signal.

Figure 2:
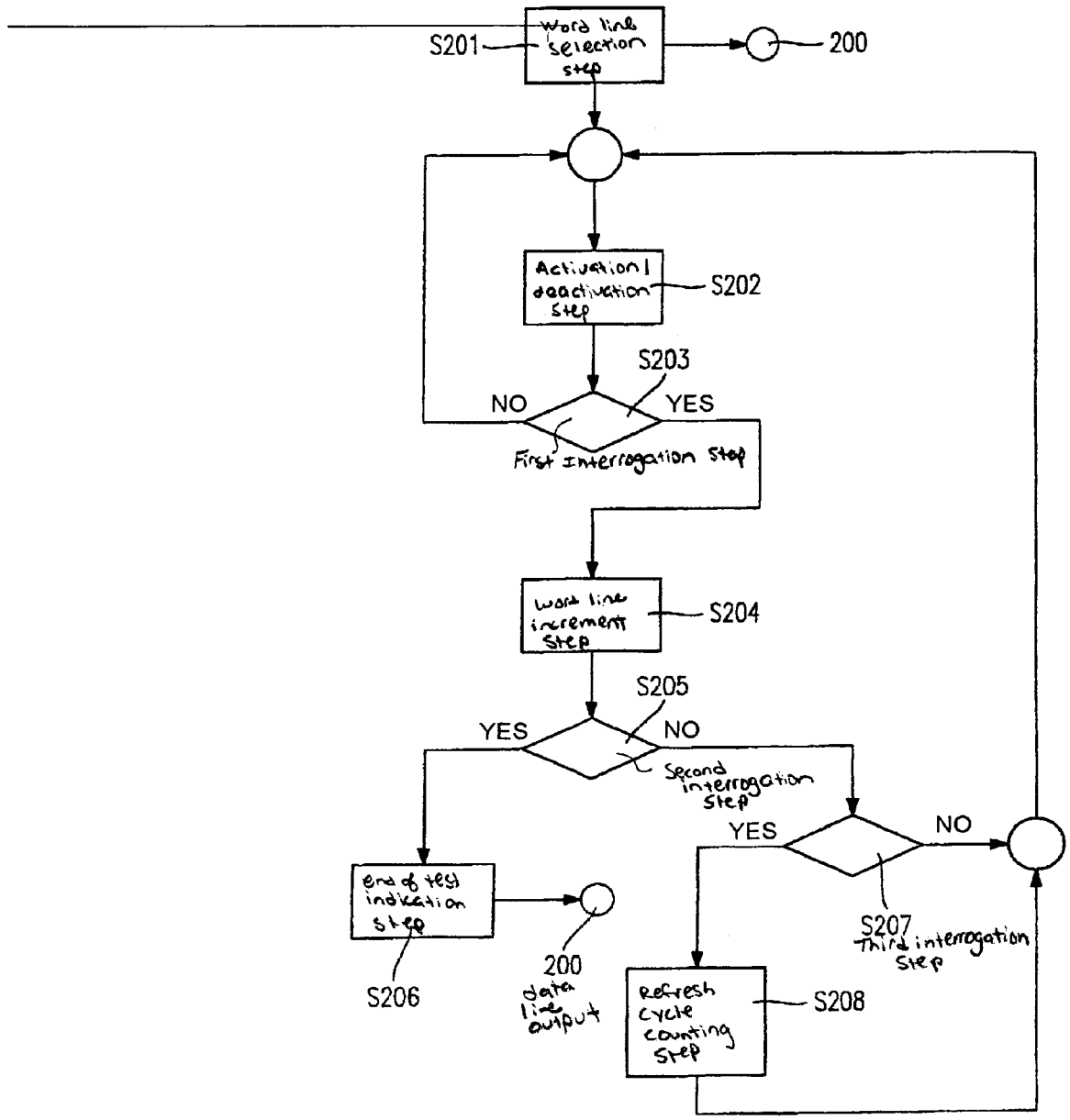
FIG. 2 shows a flow diagram of a method for testing a circuit unit to be tested, in which a test time is reduced.

A flow diagram of a method for testing a circuit unit 101 to be tested, in which a test time is reduced, is illustrated diagrammatically in FIG. 2.

The processing begins at a step S201, a first word line 102a being selected. An activation-deactivation pulse generated every 70 ns (nanoseconds) by means of the internal oscillator 104 is repeated on the word line of all the circuit subunits 105a–105d until a number of predeterminable activation-deactivation cycles have elapsed.

After the word line selection step S201 and the activation-deactivation step S202, in which activation-deactivation cycles of a predeterminable number are carried out, the processing advances to a first interrogation step S203.

In step S203, an interrogation is effected to determine whether the predeterminable number of activation-deactivation cycles has been processed. If the predeterminable number of activation-deactivation cycles has not been processed, the processing returns to step S202 for a renewed activation-deactivation cycle.

If it is ascertained in step S203 that the predeterminable number of activation-deactivation cycles has been processed, the processing advances to a word line incrementing step S204, in which a next word line is addressed by the ring counter 108. After the word line incrementing step S204, the processing advances to a second interrogation step S205, in which an interrogation is effected to determine whether a predeterminable maximum number of word lines has run through an activation-deactivation cycle.

If it is determined in the second interrogation step S205 that the predeterminable maximum number of word lines has not yet been reached, then the processing advances to a third interrogation step S207, in which an interrogation is effected to determine whether a number—set in a subregister 112b—of word lines that have completely run through an activation-deactivation cycle has been reached since a refresh cycle, or whether the last word line has already been activated/deactivated.

If it is ascertained in the third interrogation step S207 that the set number of word lines has been reached, a refresh cycle (in the case of 256 MB, 8192 activation-deactivation cycles) takes place with identical internal timing to that for the activation-deactivation cycles.

After a refresh cycle, executed in a refresh cycle counting step S208, the ring counter 108, as a result of an overflow, again stands at the address of the word line to be activated/deactivated next, which had already been selected before a refresh cycle.

If it is ascertained in the third interrogation step S207 that the number—set in the subregister 112—of completely activated/deactivated word lines has not yet been reached, the processing returns to the activation-deactivation step S202.

If it is ascertained in the second interrogation step S205 that the predeterminable maximum number of word lines has been reached, then the processing advances to an end of test indication step S206, a data line output being set to a logic one level in order to indicate to the test apparatus 100 that a control/read-out sequence can be started, the data line output 200 having been set to a logic zero level in the word line selection step S201.

Figure 3:
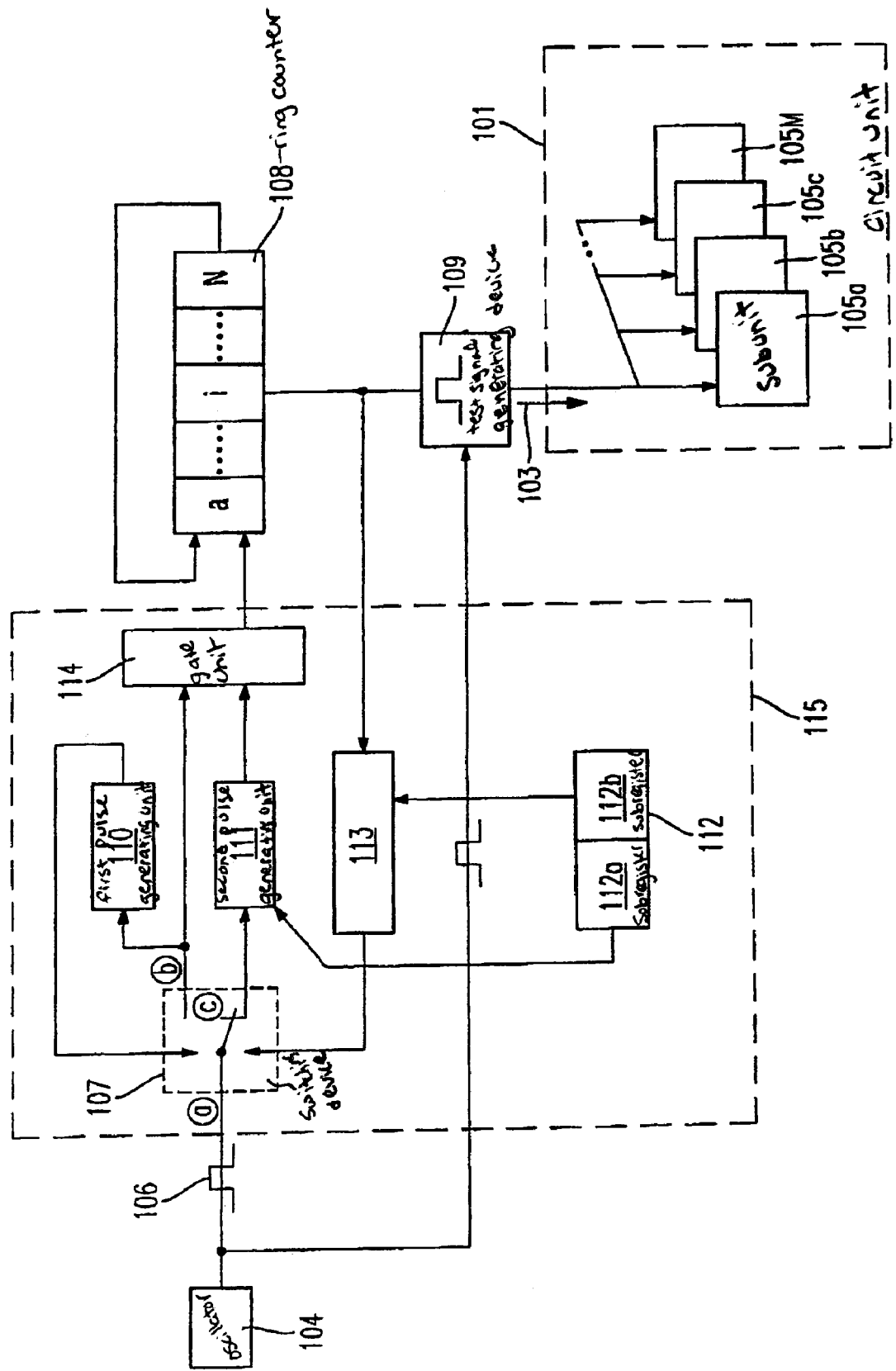
FIG. 3 shows a block diagram of a circuit arrangement for testing a circuit unit to be tested, which comprises circuit subunits to be tested, by means of a test signal in accordance with an exemplary embodiment of the present invention.

The block diagram shown in FIG. 3 illustrates an arrangement of a test apparatus for testing a circuit unit 101 to be tested, which is subdivided into circuit subunits 105a–105M to be tested.

Generally, the test signal 103 is applied to the circuit subunits 105a–105M to be tested, the test signal 103 generated in the test signal generating device 109 being applied to specific word lines that can be predetermined by the counter reading of the ring counter 108. Synchronization of a test operation is performed by the internal oscillator 104. The output signal of the oscillator 104 is fed as a clock signal 106 to an input contact (a) of the switching device 107 and the test signal generating device 109. The switching device 107 relays the clock signal 106 in accordance with a specification of a first pulse generating unit 110 and a second pulse generating unit 111 to a gate unit 114, designed as an OR gate.

A test sequence is controlled by values stored in a register unit 112, the register unit 112 being formed from two subregisters 112a, 112b, for example. The value stored in the subregister 112a serves for processing a clock signal conducted through to the second pulse generating unit 111 in a switch position (a–c), an output pulse being output by the second pulse generating unit 111 after a number of input clock signals which correspond to a value in the subregister 112a.

The value in the subregister 112b controls a third pulse generating unit, which outputs a pulse when the following relationship is satisfied:

Word line modulo (value in the register 112b)=0

Switching of the switching device 107 for making contact with the connections (a–b) is brought about when the first pulse generating unit provides a pulse after 8192 clock cycles.

What is achieved in a switch position of the switching device 107 (a–b) is that each individual pulse of the clock signal 106 is forwarded to the gate unit 114 and thus to the ring counter 108, which successively addresses word lines 102a–102N.

What is achieved by the activation-deactivation cycle time of 70 ns that can be predetermined by the internal oscillator 104 is that a sequence time for a test is reduced, i.e. a total time is calculated as:

70 ns×125,000 (number of activation-deactivation cycles, compared with the above example)× 8192 (word lines per circuit subunit 105a–105M to be tested, it being assumed that all the circuit subunits are tested simultaneously)=71.68 seconds Compared with a conventional method described above for testing a circuit unit to be tested, there results a considerable shortening of a test time of 71 seconds compared with 1638 seconds, which now only corresponds to a proportion of 4.3% of an original activation-deactivation cycle time.

This results in a considerable economic advantage of the method according to the invention for testing a circuit unit to be tested compared with methods according to the prior art.

An activation-deactivation cycle of the at least one word line 102a–102N, which cycle is controlled by the internal oscillator 104 of the circuit unit 101 to be tested, corresponds to timing by an internal refresh cycle. Furthermore, the activation-deactivation cycle on the at least one word line 102a–102N, which cycle is controlled by the internal oscillator 104 of the circuit unit 101 to be tested, acts simultaneously on all the circuit subunits 105a–105M of the circuit unit to be tested, thereby producing the above-described advantage in a shortening of a test sequence.

The activation-deactivation cycle on the at least one word line 102a–102N, which cycle is furthermore controlled by the internal oscillator 104 of the circuit unit 101 to be tested, is carried out with a frequency which corresponds to a frequency of the refresh cycle of the circuit unit to be tested.

The circuit unit to be tested, which is generally formed from a predeterminable number of circuit subunits 105a–105M, may be formed as a memory unit or a DRAM unit (DRAM=dynamic random access memory).

Although the present invention has been described above using preferred exemplary embodiments, it is not restricted thereto, but rather can be modified in diverse ways.

The invention claimed is:

1. A method for testing a circuit, the method comprising:
    activating a word line of the circuit, thereby applying a test signal to the word line of the circuit;
    deactivating the word line;
    providing a clock signal using an oscillator internal to the circuit;
    generating the test signal;
    addressing the word line of the circuit using a ring counter;
    applying the test signal to the addressed word line;
    applying the clock signal to the ring counter; and
    connecting the oscillator internal to the circuit to one of a first or a second pulse generating units using a switching device.

2. The method of claim 1, further comprising deriving the test signal from the oscillator internal to the circuit.

3. The method of claim 1, further comprising controlling the activating and deactivating of the word line with the oscillator internal to the circuit.

4. The method of claim 3, wherein controlling the activating and deactivating corresponds to an internal refresh cycle.

5. The method of claim 3, wherein controlling the activating and deactivating comprises activating the test signal simultaneously to a plurality of circuit sub-units of the circuit and deactivating the test signal simultaneously from the plurality of circuit sub-units.

6. The method of claim 3, wherein controlling the activating and deactivating of the test signal comprises activating and deactivating the test signal at a frequency that corresponds to a frequency of an internal refresh cycle.

7. The method of claim 1, wherein activating and deactivating the test signal comprises generating an activation-deactivation pulse at intervals less than or equal to 70 nanoseconds.

8. The method of claim 1, further comprising applying a refresh cycle to the circuit after the lapse of a predetermined interval.

9. An apparatus for testing a circuit, the apparatus comprising:
    an oscillator internal to the circuit for providing a clock signal;
    a test-signal generator for generating and applying a test signal;
    a ring counter for addressing a word line of the circuit; and
    a clock-signal conditioning unit for applying the clock signal to the ring counter, wherein the clock signal conditioning unit comprises:
        a first pulse generating unit,
        a second pulse generating unit, and
        a switching device for connecting the internal oscillator to one of the first or the second pulse generating units.

10. The apparatus of claim 9, wherein the circuit comprises a memory circuit.

11. The apparatus of claim 10, wherein the circuit comprises a DRAM.

12. The apparatus of claim 9, wherein the clock signal conditioning unit comprises a register unit for storing values for controlling the test signal.

13. The apparatus of claim 12, wherein the register unit comprises a first subregister for storing a value for controlling the second pulse generating units.

14. The apparatus of claim 12, wherein the register unit comprises a second subregister for storing a value corresponding to a number of word lines and for carrying out a refresh cycle dependent on the value stored in the second subregister.

\* \* \* \* \*